United States Patent
Kobayashi

(10) Patent No.: US 8,287,649 B2
(45) Date of Patent: Oct. 16, 2012

(54) VERTICAL BOAT FOR HEAT TREATMENT AND METHOD FOR HEAT TREATMENT OF SILICON WAFER USING THE SAME

(75) Inventor: Takeshi Kobayashi, Nishishirakawa (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 150 days.

(21) Appl. No.: 12/936,286

(22) PCT Filed: Apr. 9, 2009

(86) PCT No.: PCT/JP2009/001649
§ 371 (c)(1),
(2), (4) Date: Oct. 4, 2010

(87) PCT Pub. No.: WO2009/128225
PCT Pub. Date: Oct. 22, 2009

(65) Prior Publication Data
US 2011/0028005 A1    Feb. 3, 2011

(30) Foreign Application Priority Data
Apr. 17, 2008 (JP) .................................. 2008-107733

(51) Int. Cl.
*H01L 21/263*    (2006.01)
*F27D 5/00*    (2006.01)
*C23C 16/458*    (2006.01)

(52) U.S. Cl. ........ 118/724; 118/715; 118/725; 118/728; 118/729; 432/258; 432/253; 432/249; 432/1; 432/5; 432/6; 438/795

(58) Field of Classification Search .................. 118/715, 118/724, 725, 728, 729; 432/1, 5, 6, 241, 432/249, 253, 254.1, 258; 438/795
See application file for complete search history.

(56) References Cited

U.S. PATENT DOCUMENTS
5,310,339 A * 5/1994 Ushikawa ..................... 432/253
(Continued)

FOREIGN PATENT DOCUMENTS
JP    A-8-107081    4/1996
(Continued)

OTHER PUBLICATIONS
International Search Report dated Jul. 21, 2009 in corresponding International Application No. PCT/JP2009/001649.

*Primary Examiner* — Jeffrie R Lund
(74) *Attorney, Agent, or Firm* — Oliff & Berridge, PLC

(57) ABSTRACT

The present invention is a vertical boat for heat treatment having an auxiliary supporting member removably attached to each of supporting parts of a boat body, the auxiliary supporting member on which a substrate to be treated is to be placed, in which the auxiliary supporting member has a guiding member attached to the supporting part and a substrate supporting plate on which the substrate to be treated is to be placed, a hole is formed on an upper surface of the guiding member, the substrate supporting plate is inserted and fitted into the hole of the guiding member so as to be fixed, a height position of a placing surface for the substrate to be treated is higher than a height position of the upper surface of the guiding member, the substrate supporting plate is composed of silicon carbide and the guiding member is composed of quartz.

12 Claims, 5 Drawing Sheets

U.S. PATENT DOCUMENTS

| | | | | |
|---|---|---|---|---|
| 5,458,688 | A * | 10/1995 | Watanabe | 118/724 |
| 5,494,524 | A * | 2/1996 | Inaba et al. | 118/728 |
| 5,516,283 | A * | 5/1996 | Schrems | 432/241 |
| 5,779,797 | A * | 7/1998 | Kitano | 118/500 |
| 5,820,367 | A * | 10/1998 | Osawa | 432/253 |
| 5,882,418 | A * | 3/1999 | Fujii et al. | 118/728 |
| 6,099,302 | A * | 8/2000 | Hong et al. | 432/259 |
| 6,171,400 | B1 * | 1/2001 | Wingo | 118/500 |
| 6,171,982 | B1 | 1/2001 | Sato | |
| 6,357,604 | B1 * | 3/2002 | Wingo | 211/41.18 |
| 6,506,665 | B1 | 1/2003 | Sato | |
| 6,576,064 | B2 * | 6/2003 | Griffiths et al. | 118/728 |
| 6,727,191 | B2 * | 4/2004 | Zehavi et al. | 438/795 |
| 6,796,439 | B2 * | 9/2004 | Araki | 211/41.18 |
| 6,799,940 | B2 * | 10/2004 | Joe et al. | 414/672 |
| 6,979,659 | B2 * | 12/2005 | Zehavi et al. | 438/795 |
| 7,204,887 | B2 * | 4/2007 | Kawamura et al. | 118/725 |
| 7,393,207 | B2 * | 7/2008 | Imai | 432/259 |
| 7,625,205 | B2 * | 12/2009 | Sasajima et al. | 432/253 |
| 2003/0003686 | A1 * | 1/2003 | Boyle et al. | 438/455 |
| 2003/0170583 | A1 * | 9/2003 | Nakashima et al. | 432/241 |
| 2003/0196588 | A1 | 10/2003 | Kobayashi et al. | |
| 2006/0199133 | A1 * | 9/2006 | Kobayashi | 432/120 |
| 2007/0275570 | A1 * | 11/2007 | Nakamura et al. | 438/795 |
| 2009/0194022 | A1 * | 8/2009 | Goela et al. | 118/500 |
| 2010/0015817 | A1 * | 1/2010 | Kobayashi | 438/795 |
| 2010/0048034 | A1 * | 2/2010 | Kobayashi | 438/795 |
| 2010/0129761 | A1 * | 5/2010 | Kobayashi | 432/253 |
| 2011/0028005 | A1 * | 2/2011 | Kobayashi | 438/795 |
| 2011/0162633 | A1 * | 7/2011 | Inoue et al. | 126/58 |

FOREIGN PATENT DOCUMENTS

| | | |
|---|---|---|
| JP | A-11-251563 | 9/1999 |
| JP | A-2004-241545 | 8/2004 |
| JP | 2005203648 A * | 7/2005 |
| WO | WO 01/59826 A1 | 8/2001 |

* cited by examiner

FIG. 3
(A)
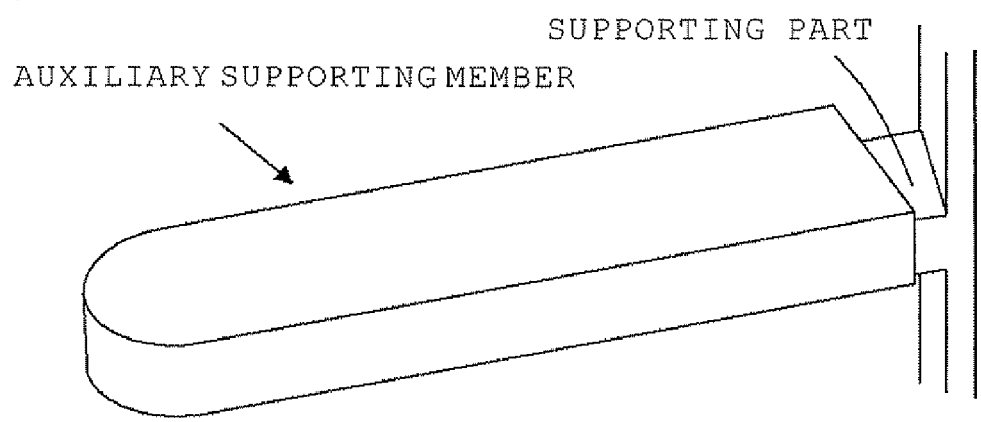
AUXILIARY SUPPORTING MEMBER
SUPPORTING PART
(B)
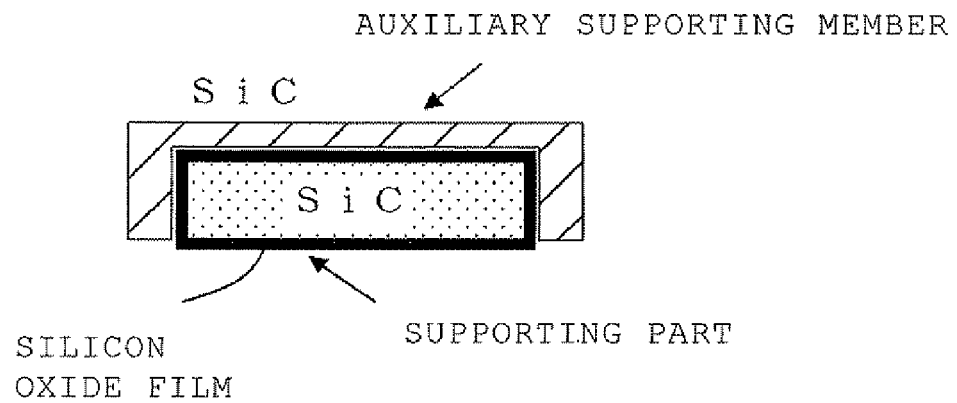
SiC
AUXILIARY SUPPORTING MEMBER
SiC
SILICON OXIDE FILM
SUPPORTING PART (A)                    (B)

VERTICAL BOAT FOR HEAT TREATMENT AND METHOD FOR HEAT TREATMENT OF SILICON WAFER USING THE SAME

TECHNICAL FIELD

The present invention relates to a vertical boat for heat treatment mainly used for performing heat treatment of a silicon wafer and the like, and to a method for heat treatment of a silicon wafer using it.

BACKGROUND ART

In the event that a device is produced by using a semiconductor wafer such as a silicon wafer, there are many steps from a process of working the wafer to a process of forming a device. There is a step of heat treatment as one of these steps. The step of heat treatment is an important process that is performed for the purpose of formation of a defect-free layer in a surface layer of the wafer, gettering, crystallization, formation of an oxide film, impurity diffusion, and the like.

As a diffusion furnace used in such step of heat treatment such as oxidation or impurity diffusion (an apparatus for oxidation and diffusion), with a larger diameter of the wafer, there has been mainly used a vertical furnace for heat treatment in which the heat treatment is performed with many wafers being horizontally supported at predetermined intervals. When the wafers are subjected to the heat treatment by using the vertical furnace for heat treatment, there is used a vertical boat for heat treatment for setting many wafers (hereinafter, occasionally referred to as "a boat for heat treatment" or simply "a boat").

FIG. 4 schematically shows a conventionally general vertical boat for heat treatment. In the vertical boat for heat treatment 101, a pair of plate members 103 (also referred to as coupling members, or a top plate and a bottom plate) are coupled to both ends of four columns 102 (rods). Many slits 105 are formed in each column 102 and a convex part between each of the slits 105 serves as a supporting part 106 for the wafer. When the wafer is subjected to the heat treatment, the peripheral part of the wafer W is placed on the supporting parts 106 formed at the same height in each column 102, as shown in a plane view in FIG. 5(A) and a front view in FIG. 5(B), and thereby the wafer W is horizontally supported.

FIG. 6 is a schematic view showing an example of the vertical furnace for heat treatment. In the boat for heat treatment 101 carried into the interior of a reaction chamber 222 of the vertical furnace for heat treatment 220, many wafers W are horizontally supported. In the heat treatment, the wafers W are heated with a heater 224 provided around the reaction chamber 222. During the heat treatment, a gas is introduced into the reaction chamber 222 through a gas feed pipe 226, flows from the upper side to the lower side, and is discharged outside from a gas exhaust pipe 228. The gas to be used is different according to a purpose of the heat treatment. However $H_2$, $N_2$, $O_2$, Ar, and the like are mainly used. In case of impurity diffusion, these gasses are also used as a carrier gas for an impurity compound gas.

Various shapes of the supporting part 106 for the wafer are adopted in the vertical boat for heat treatment 101, and each of FIGS. 7(A) and (B) shows an example thereof. In (A), semicircular supporting parts 106' are formed by providing concave slits 105' (grooves) in a cylindrical column 102'. In (B), on the other hand, rectangular supporting parts 106" are formed by providing concave slits 105" in a wide rectangular column 102" so as to support a portion of the wafer W closer to its center than that in (A). There are other supporting parts having slits with another shape such as an arc shape or a hook shape.

In the case of using the vertical boat for heat treatment, when the heat treatment is performed at a high temperature particularly for the purpose of oxidation or impurity diffusion and the like, internal stress is caused due to a wafer's own weight, or thermal stress is caused due to non-uniform temperature distribution in the wafer. When these stresses exceed a certain critical value, slip (slip dislocation), which is a crystal defect, is generated in the wafer. It has been known that since this critical value for the generation of the dislocation becomes rapidly smaller at a higher temperature, the slip dislocation is more easily generated with a higher temperature. Forming a device at a location where the slip dislocation has been generated causes junction leakage and the like, and thereby a yield of a device fabrication may be remarkably reduced.

For example, in the case of using a conventional boat with supporting parts 106' or 106" formed as shown in FIGS. 7(A) and (B), the slip is easy to be generated at a portion which comes in contact with the tip of each supporting part. This is because the wafer may be brought into point contact with the supporting part at the tip.

For example, in the case of the boat for heat treatment merely in which each of the supporting parts is CVD-coated with SiC, its surface has Ra (center line average roughness) of approximately 1 μm, that is very rough, and thereby, when the wafer is placed on the supporting part, the wafer is supported at a very small elevated portion (a local projection) by the point contact. It is considered that the internal stress due to the wafer's own weight is consequently increased locally, so that the slip is easy to be generated.

In order to prevent the generation of the slip as described above, measures are taken such that the tip of the supporting part is chamfered or the elevated portion of the supporting part for the wafer is removed by polishing its surface and the like.

However, the supporting part of the boat for heat treatment has a problem of being broken easily during chamfering or polishing processing with a machine and the like because it is thin and fragile. If a single supporting part is broken, the whole of the boat becomes a failure product. Accordingly, a complete mirror-polishing requires a manual operation and the like, but surface roughness of each supporting part tends to vary. In addition, the mirror-polishing of all supporting parts requires a lot of labor and the boat consequently becomes very expensive.

Moreover, establishment of the optimal shape of the supporting part with respect to the surface roughness, the chamfering of the tip and the like requires production of various boats for heat treatment having various surface roughness and various chamfered shapes and a lot of preliminary experiments. However, since the boat for heat treatment is expensive, the experiments with various boats for heat treatment costs a lot.

In order to solve these problems, Japanese Unexamined Patent publication (Kokai) No. 2004-241545 discloses a boat having auxiliary supporting members removably attached to the wafer supporting parts. According to the disclosure, in case of the described boat, since the auxiliary supporting member can be removably attached, the chamfering or polishing processing can be easily performed, at low cost, on a surface of a desired auxiliary supporting member where the wafer is to be placed, and the generation of the slip can be effectively suppressed by attaching the auxiliary supporting member subjected to the polishing processing or the like to the supporting part to place the wafer on it and by performing the heat treatment.

With regard to materials of the boat, quartz ($SiO_2$), silicon carbide (SiC), silicon (Si) and the like are usually used, e.g. for a silicon wafer to prevent contamination of the wafer. For example, in heat treatment processing at a high temperature over 1000° C., the boat composed of SiC or Si, which has higher heat resistance than the boat composed of quartz ($SiO_2$), is used. In particular, since the SiC boat can more reduce metal contamination generated during the heat treatment by CVD-coating it with SiC, it is used more often.

However, when the surface CVD-coated with SiC is subjected to, for example, mirror-polishing, a surface layer portion of a SiC film has a high Fe metal contamination concentration in some cases. In this case, when the wafer is placed to perform the heat treatment, Fe metal contamination transfer may occur. The metal contamination transfer can be prevented by forming an oxide film on the surface of the boat for heat treatment. For reasons of this, there has been used the auxiliary supporting member composed of SiC in which the oxide film is formed on its surface.

However, when the wafer is placed on the auxiliary supporting member composed of SiC in which the oxide film is formed and is subjected to the heat treatment under an argon atmosphere, an amount of the Fe metal contamination transfer is reduced, but a back surface of the silicon wafer is roughened by the oxide film in some cases.

On the other hand, in the event that the oxide film is not formed on the auxiliary supporting member, there is a problem such that Fe generated from a side face of the auxiliary supporting member contaminates the surface of the wafer placed in a next stage.

DISCLOSURE OF INVENTION

The present invention was accomplished in view of the above-explained problems, and its object is to provide a vertical boat for heat treatment and a method for heat treatment of a silicon wafer using it that enable both of Fe contamination transfer to the silicon wafer and surface roughening on the back surface of the silicon wafer to be suppressed at the time of performing heat treatment using argon and the like with a substrate to be treated, such as a silicon wafer, placed on the vertical boat for heat treatment having the auxiliary supporting member.

To achieve this object, the present invention provides a vertical boat for heat treatment having at least a boat body having: a plurality of columns; a pair of plate members coupled to both ends of each column; and a plurality of supporting parts on each column, each supporting part horizontally supporting a substrate to be treated, and an auxiliary supporting member removably attached to each of the plurality of the supporting parts, the auxiliary supporting member on which the substrate to be treated is to be placed, wherein the auxiliary supporting member has a guiding member attached to each supporting part and a substrate supporting plate fixed by the guiding member, the substrate supporting plate on which the substrate to be treated is to be placed, a hole is formed on an upper surface of the guiding member, the substrate supporting plate is inserted and fitted into the hole of the guiding member so as to be fixed, a height position of a surface on which the substrate to be treated is to be placed is higher than a height position of the upper surface of the guiding member with the auxiliary supporting member attached to the supporting part of the boat body, the substrate supporting plate is composed of any of silicon carbide, silicon, silicon carbide CVD-coated with silicon carbide, silicon CVD-coated with silicon carbide, and carbon CVD-coated with silicon carbide, and the guiding member is composed of any of quartz, silicon carbide on which a silicon oxide film is formed, silicon carbide on which a silicon nitride film is formed, silicon carbide on which a silicon oxynitride film is formed, silicon on which a silicon oxide film is formed, silicon on which a silicon nitride film is formed, silicon on which a silicon oxynitride film is formed.

As described above, for example, in the case of the boat provided with the SiC auxiliary supporting member in which the oxide film is formed like a conventional boat, the back surface of the substrate to be treated is roughened by the oxide film, the back surface which comes into contact with the oxide film. On the other hand, in the event that the oxide film is not formed on the auxiliary supporting member, the wafer surface is contaminated by Fe from a side face of the auxiliary supporting member.

However, in the auxiliary supporting member of the vertical boat for heat treatment of the present invention, the substrate supporting plate, where the substrate to be treated is to be placed, is inserted and fitted into the hole formed on the upper surface of the guiding member attached to the supporting part so as to be fixed, the height position of the surface of the substrate supporting plate on which the substrate to be treated is to be placed is higher than the height position of the upper surface of the guiding member, and moreover the substrate supporting plate is composed of any of silicon carbide, silicon, silicon carbide CVD-coated with silicon carbide, silicon CVD-coated with silicon carbide, and carbon CVD-coated with silicon carbide. Thus, the oxide film is not formed on a portion where comes into contact with the substrate to be treated, such as a silicon wafer, and the back surface of the substrate to be treated does not come into contact with the oxide film at the time of performing the heat treatment with the substrate to be treated placed. The roughening the back surface of the substrate to be treated can be consequently suppressed.

Moreover, the guiding member of the auxiliary supporting member for supporting the substrate is composed of any of quartz, silicon carbide on which a silicon oxide film is formed, silicon carbide on which a silicon nitride film is formed, silicon carbide on which a silicon oxynitride film is formed, silicon on which a silicon oxide film is formed, silicon on which a silicon nitride film is formed, silicon on which a silicon oxynitride film is formed. Thus, an amount of the Fe metal contamination transfer from the whole of the auxiliary supporting member to the surface of the substrate to be treated can be greatly reduced for that.

As describe above, the present invention can provide a heat-treated substrate in which both of the Fe contamination transfer to the substrate to be treated and the surface roughening on the back surface of the substrate to be treated, which are conventional problems, can be suppressed at the same time.

In this case, the boat body can be composed of any of quartz, silicon carbide on which a silicon oxide film is formed, silicon carbide on which a silicon nitride film is formed, silicon carbide on which a silicon oxynitride film is formed, silicon on which a silicon oxide film is formed, silicon on which a silicon nitride film is formed, silicon on which a silicon oxynitride film is formed.

In this manner, when the boat body is composed of any of quartz, silicon carbide on which a silicon oxide film is formed, silicon carbide on which a silicon nitride film is formed, silicon carbide on which a silicon oxynitride film is formed, silicon on which a silicon oxide film is formed, silicon on which a silicon nitride film is formed, silicon on which a silicon oxynitride film is formed, an amount of the Fe metal contamination transfer from the boat body can be reduced, and consequently the Fe contamination on the surface of the substrate to be treated can be more reduced.

Moreover, the difference between the height position of the surface of the substrate supporting plate on which the substrate to be treated is to be placed and the height position of the upper surface of the guiding member is preferably 0.05 to 1.0 mm.

In this manner, when the difference between the height position of the surface of the substrate supporting plate on which the substrate to be treated is to be placed and the height position of the upper surface of the guiding member is 0.05 mm or more, that is, when the height position of the surface of the substrate supporting plate on which the substrate to be treated is to be placed (a substrate placing surface) is 0.05 mm higher than the height position of the upper surface of the guiding member, the substrate to be treated can avoid coming into direct contact with the guiding member at the time of placing the substrate to be treated on the substrate supporting plate. An upper limit of the difference of the height position is preferably 1.0 mm to suppress the Fe contamination from the side face of the substrate supporting plate, which is located at a higher position than the upper surface of the guiding member.

Furthermore, the present invention provides a method for heat treatment of a silicon wafer using the foregoing vertical boat for heat treatment comprising steps of: attaching the auxiliary supporting member to each of the plurality of the supporting parts; placing the silicon wafer on the substrate supporting plate of the auxiliary supporting member; and performing the heat treatment.

By the method for heat treatment as described above, the heat treatment can be performed without bringing the back surface of the silicon wafer into contact with the oxide film formed on the surface of the auxiliary supporting member, unlike a conventional method, and the roughening on the back surface of the silicon wafer caused by the contact with the oxide film can be prevented.

At the same time, an amount of the Fe metal contamination transfer from the auxiliary supporting member to the surface of the substrate to be treated can be greatly reduced.

In this case, the heat treatment of the silicon wafer can be performed at 1100 to 1350° C.

In case of such heat treatment with a high temperature, the metal contamination due to Fe and the like conventionally became a problem. However, the method for heat treatment according to the present invention can effectively suppress the metal contamination, and thus is highly useful for solving the problem.

As described above, with the vertical boat for heat treatment and the method for heat treatment of a silicon wafer using it according to the present invention, the heat-treated wafer can be produced in which both of the Fe contamination transfer to the substrate to be treated, such as a silicon wafer, and the surface roughening on the back surface of the wafer, which may be caused by the conventional auxiliary supporting member and the like in the heat treatment, are suppressed.

BRIEF DESCRIPTION OF THE DRAWINGS

FIG. 3 are explanatory views showing an example of a conventional auxiliary supporting member, in which (A) shows a condition where the auxiliary supporting member is attached to the supporting part, and (B) shows a sectional view of the auxiliary supporting member attached to the supporting part;

BEST MODE FOR CARRYING OUT THE INVENTION

Figure 1:
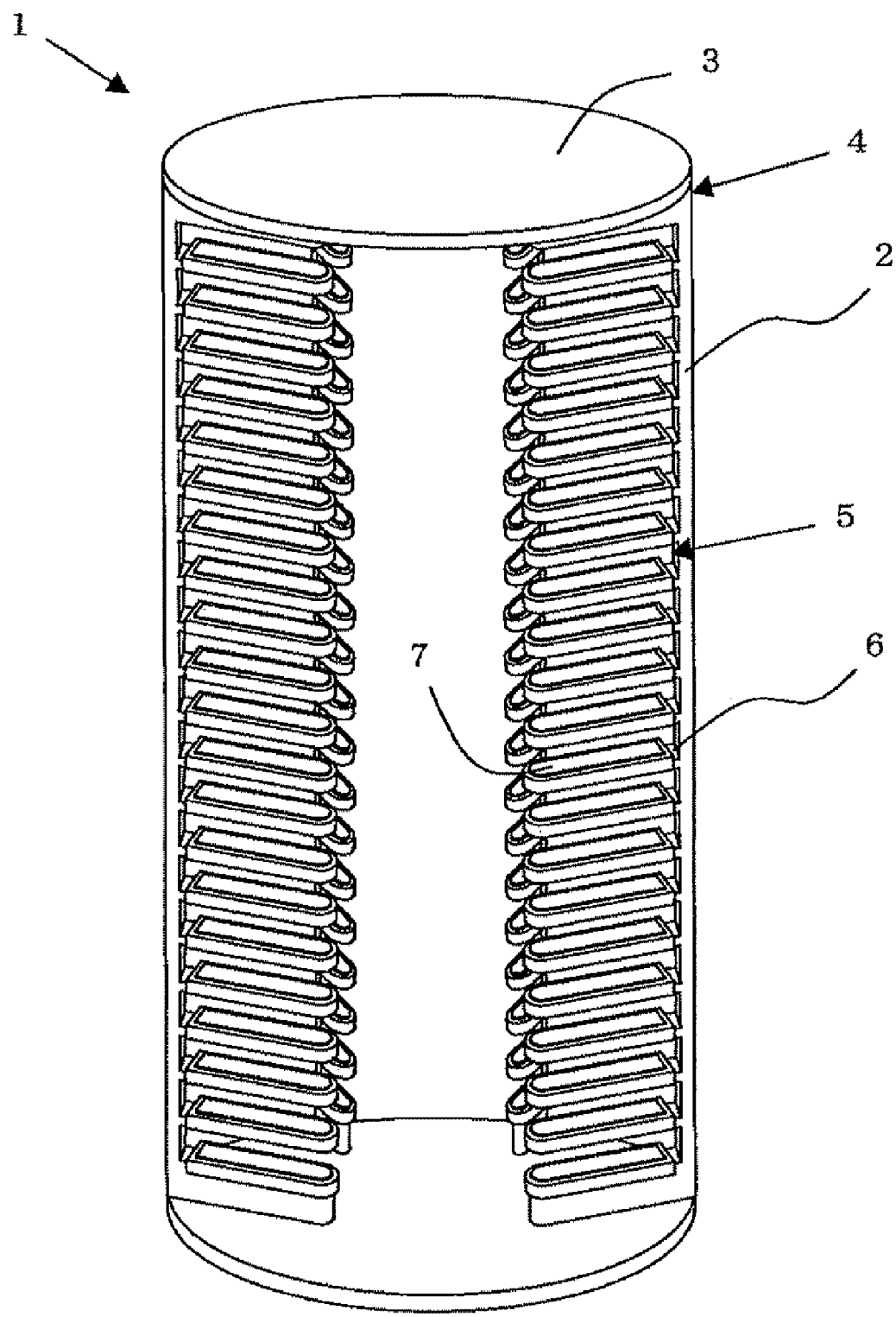
FIG. 1 is a schematic view showing an example of the vertical boat for heat treatment according to the present invention.

Hereinafter, an embodiment according to the present invention will be explained, but the present invention is not restricted thereto.

In the case of performing the heat treatment of the substrate to be treated having a large diameter such as a semiconductor wafer, there has been mainly used the vertical furnace for heat treatment in which the heat treatment is performed with many wafers being horizontally supported at predetermined intervals. The vertical boat for heat treatment for setting many wafers is used in this heat treatment, but in case of a conventional boat, there has been instances that the slip is generated in the wafer after the heat treatment.

This is because each of the supporting parts is merely CVD-coated, for example, with SiC in the conventional boat, its surface is very rough and when the wafer is placed on the supporting part, the wafer is supported by the point contact. However, it is difficult to polish the rough surface CVD-coated with SiC, and it costs a lot.

In view of the problem of the generation of the slip due to the local projection as described above, for example as described in Japanese Unexamined Patent publication (Kokai) No. 2004-241545, prevention of the slip is attempted by using the boat in which the auxiliary supporting member is removably attached to the wafer supporting part.

For example, in the case of the heat treatment at a high temperature over 1100° C., there is usually used the auxiliary supporting member composed of silicon carbide, which has high heat resistance, throughout the whole of it. The surface of this auxiliary supporting member is subjected to the mirror-polishing in order to prevent the slip so that the surface is in a smooth condition.

However, there arises the problem such that the auxiliary supporting member is contaminated by high concentration Fe particularly during the mirror-polishing or the like, and the wafer is contaminated by the transfer of the Fe from the auxiliary supporting member to the wafer surface. This Fe contamination can be reduced by covering the surface of the auxiliary supporting member with the oxide film. However, there arises another problem of roughening a contact portion of the heat-treated wafer with the auxiliary supporting member in which its surface is covered with the oxide film.

In view of this, the present inventor has found that the Fe contamination from the auxiliary supporting member to the wafer and the roughening on the wafer back surface due to the contact with the oxide film can be reduced during the heat treatment by the following features.

That is, the auxiliary supporting member of the vertical boat for heat treatment is divided into the substrate supporting plate for supporting the substrate to be treated and the guiding member attached to the supporting part of the boat for fixing the substrate supporting plate, the substrate supporting plate is composed of any of silicon carbide, silicon, silicon carbide CVD-coated with silicon carbide, silicon CVD-coated with silicon carbide, and carbon CVD-coated with silicon carbide, and the guiding member is composed of any of quartz, silicon carbide on which a silicon oxide film is formed, silicon carbide on which a silicon nitride film is formed, silicon carbide on which a silicon oxynitride film is formed, silicon on which a silicon oxide film is formed, silicon on which a silicon nitride film is formed, silicon on which a silicon oxynitride film is formed.

Thereby, the present inventor has brought the present invention to completion.

Hereinafter, the vertical boat for heat treatment and the method for heat treatment of a silicon wafer using it according to the present invention will be explained in detail with reference to the drawings. However the present invention is not restricted thereto.

FIG. 1 shows an example of the vertical boat for heat treatment according to the present invention. This vertical boat for heat treatment 1 comprises four columns 2 and a pair of the plate members 3 coupled to both ends of each column 2 (these structure is referred to as the boat body 4). A plurality of slits 5 (grooves) are formed with them equally spaced each other so as to be located at the same height respectively in each of the supporting columns 2, and convex parts between the slits 5 serve as supporting parts 6 for the substrate to be treated (here, a silicon wafer is exemplified, but the present invention is not restricted thereto).

In the boat for heat treatment 1 according to the present invention, the auxiliary supporting members 7 are removably attached to the supporting parts 6 of each column 2. When the wafers are subjected to the heat treatment, each one of the wafers is placed on the auxiliary supporting members 7 attached to the supporting parts 6 located at the same height in each supporting columns 2.

Figure 2:
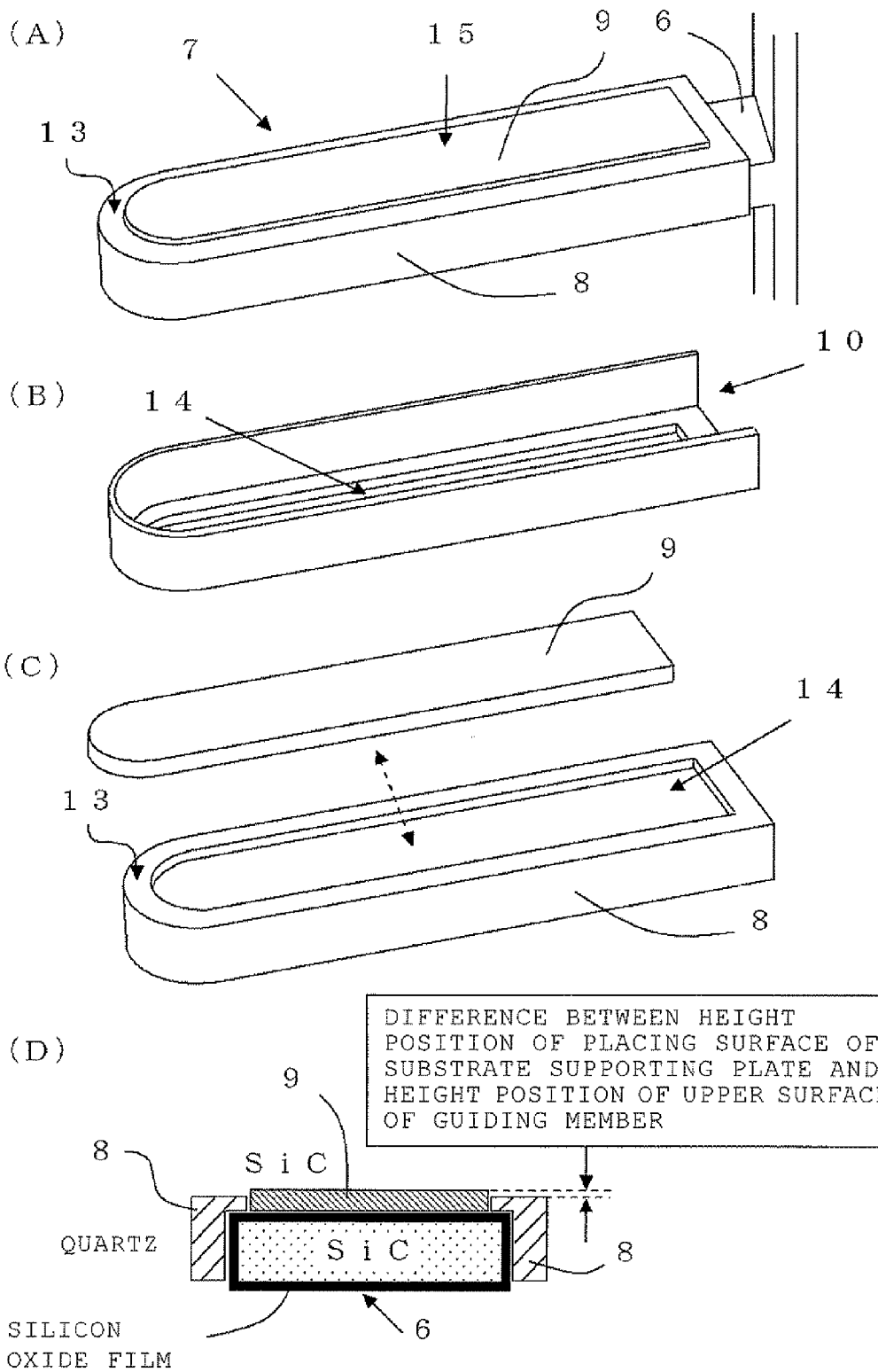
FIG. 2 are explanatory views showing an example of the auxiliary supporting member according to the present invention, in which (A) shows a condition where the auxiliary supporting member is attached to the supporting part, (B) shows a back side of the guiding member, (C) shows a condition where the guiding member and the substrate supporting plate are separated, and (D) shows a sectional view of the auxiliary supporting member attached to the supporting part.
Figure 4:
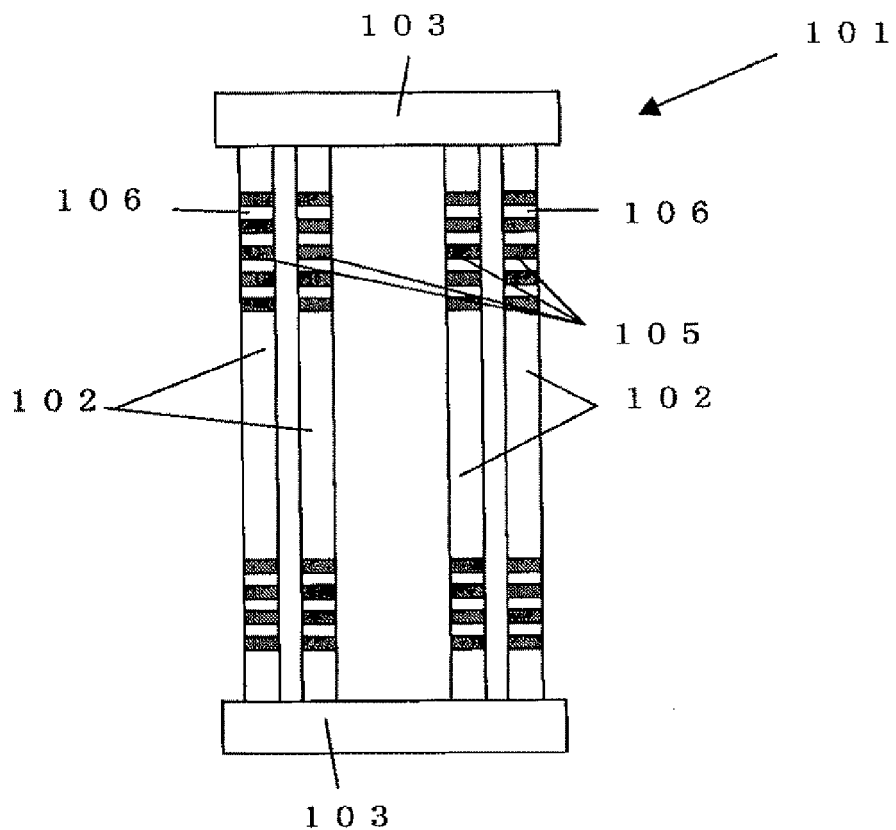
FIG. 4 is a schematic view showing an example of a conventional vertical boat for heat treatment.
Figure 5:
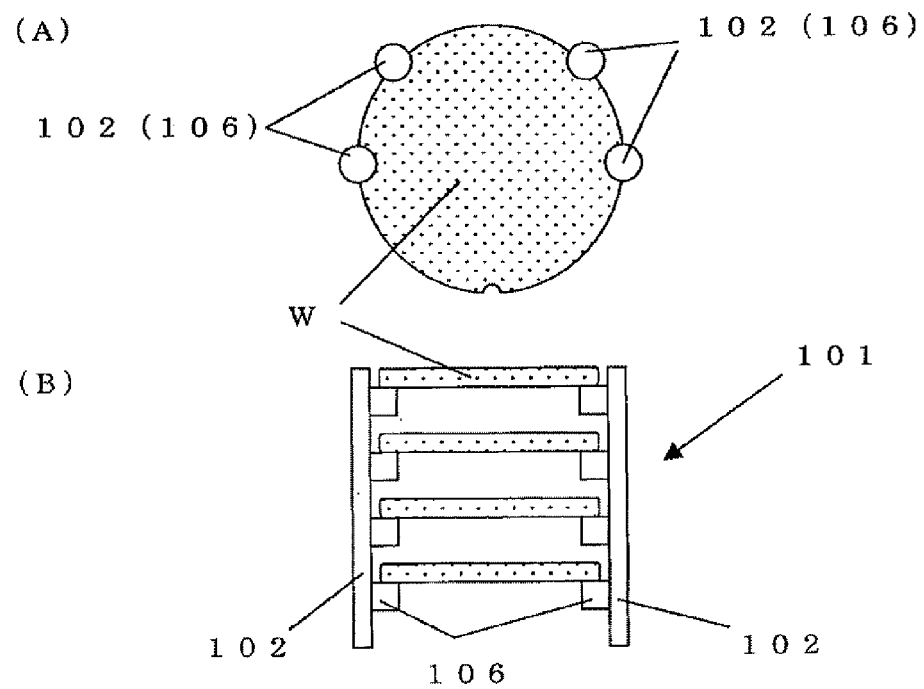
FIG. 5 is an explanatory view showing a condition where the wafers are set on a conventional vertical boat for heat treatment.
Figure 6:
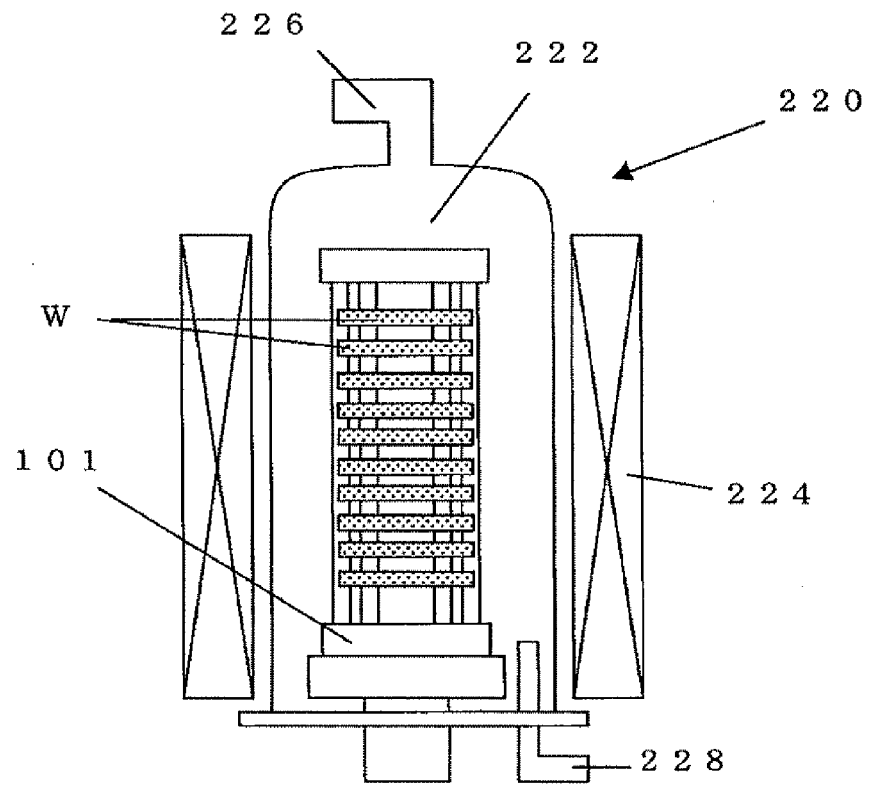
FIG. 6 is a schematic view showing an example of a vertical furnace for heat treatment.
Figure 7:
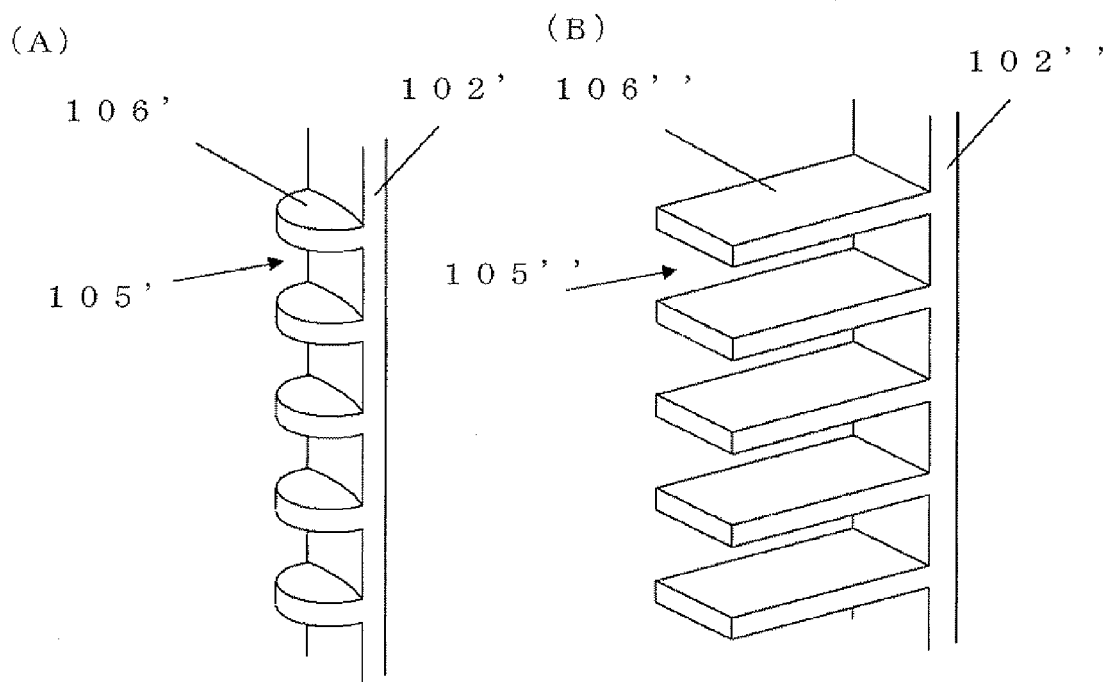
FIG. 7 are schematic views showing the wafer supporting part of a conventional vertical boat for heat treatment.

Here, the auxiliary supporting member 7 will be described. FIG. 2 show an example of the auxiliary supporting member according to the present invention. As shown in FIG. 2, the auxiliary supporting member 7 has the guiding member 8 provided with a guiding means so as to be removably attached to the supporting part 6 of the boat 1 and the substrate supporting plate 9 on which the silicon wafer is practically placed during the heat treatment. FIG. 2(A) shows a condition where the auxiliary supporting member 7 is attached to the supporting part 6. FIG. 2(B) shows a back side of the guiding member. FIG. 2(C) shows a condition where the guiding member 8 and the substrate supporting plate 9 have been separated. FIG. 2(D) is a sectional view of the auxiliary supporting member 7 attached to the supporting part 6. It is to be noted that in FIG. 2(D), exemplified are the supporting part 6 composed of silicon carbide in which a silicon oxide film is formed on its surface, the substrate supporting plate 9 composed of silicon carbide (the oxide film is not formed on its surface), and the guiding member 8 composed of quartz.

First, in the guiding member 8, the guiding means is not restricted in particular as long as the guiding member 8 can be removably attached to the supporting part 6.

For example, as shown in FIG. 2(B), a groove 10 can be formed on a lower surface of the guiding member 8 (a surface on the side of being attached to the supporting part 6). The groove 10 for this attachment is formed so as to fit the supporting part 6 of the boat into the groove, and the guiding member 8 can be attached to the supporting part 6 by fitting the supporting part 6 into this groove 10. It is preferable that a shape of the supporting part 6 is measured in advance and then the groove 10 of the guiding member 8 is formed on the basis of the measurement data.

As shown in FIG. 2(C), the hole 14 is formed on the upper surface 13 of the guiding member 8. A shape of the hole 14 is not restricted in particular as long as it is formed so as to be able to insert and fit the substrate supporting plate 9 into it. Its size is preferably in the range such that it is smaller than the shape of the guiding member 8 and the substrate supporting plate 9 is completely covered by the silicon wafer during the heat treatment. For example, it can be slightly smaller than the shape of the guiding member and in a similarity shape, a rectangular shape or the like.

Moreover, a depth of the hole 14 is also not restricted in particular. It can be the hole having a groove shape without penetrating or the hole penetrating to a lower surface side as shown in FIG. 2. In consideration for a thickness of the substrate supporting plate 9 and the difference between the height position of the upper surface 13 of the guiding member 8 and the height position of the surface of the substrate supporting plate 9 on which the silicon wafer is to be placed (a placing surface 15), as described later, the hole can be formed with an appropriate depth.

As described above, the substrate supporting plate 9 is formed so as to be able to be inserted and fitted into the hole 14 of the upper surface 13 of the guiding member 8. Its shape is not restricted in particular as long as it can be inserted and fitted into the hole 14.

A thickness of the guiding member 8 and the substrate supporting plate 9 is set in such a manner that the height position of the placing surface 15 for the silicon wafer of the substrate supporting plate 9 is higher than the height position of the upper surface 13 of the guiding member 8 with the substrate supporting plate 9 inserted and fitted into the hole 14 of the guiding member 8 (See FIG. 2(D)). For example, the thickness of the guiding member 8 and the substrate supporting plate 9 can be set so that the difference of the height position between the upper surface 13 and the placing surface 15 is 0.05 to 1.0 mm.

When the placing surface 15 of the substrate supporting plate 9 is at least 0.05 mm higher than the upper surface 13 of the guiding member 8, the placed silicon wafer can be more effectively prevented from coming into direct contact with the guiding member 8. Such difference is preferable also from the viewpoint of machining precision.

On the other hand, when the substrate supporting plate 9 is too thick, the Fe contamination from the side face of the substrate supporting plate 9 is easy to be a problem. Accordingly, it is preferably as thin as possible. For example, when the difference described above is approximately 1.0 mm or less, the Fe contamination from the side face of the substrate supporting plate 9 can be more effectively prevented.

With regard to materials of each of the members described above, the substrate supporting plate 9 is composed of any of silicon carbide, silicon, silicon carbide CVD-coated with silicon carbide, silicon CVD-coated with silicon carbide, and carbon CVD-coated with silicon carbide.

The substrate supporting plate 9 composed of such a material has high heat resistance and is easy to be worked. The placing surface 15, which is to come into direct contact with the silicon wafer, is preferably subjected to the mirror-polishing form the viewpoint of the slip prevention. In regard to this point, the easiness of the working as described above is effective.

Moreover, when the substrate supporting plate 9, which is to come into direct contact with the silicon wafer, is composed of the material without the oxide film and the like except quartz, the roughening on the wafer back surface can be reduced.

In the event that the substrate supporting plate 9 is not completely covered with the silicon wafer with the silicon wafer placed and some part of it is uncovered, a Fe contaminant is released into an atmosphere from the uncovered part. Accordingly, it is preferable to be such the shape and size of the substrate supporting plate 9 that it is completely covered with the silicon wafer when the silicon wafer is placed.

As compared with this, the guiding member 8 is composed of any of quartz, silicon carbide on which a silicon oxide film is formed, silicon carbide on which a silicon nitride film is formed, silicon carbide on which a silicon oxynitride film is formed, silicon on which a silicon oxide film is formed, silicon on which a silicon nitride film is formed, silicon on which a silicon oxynitride film is formed.

As described above, when the guiding member is composed of quartz or the material on which the oxide film and the like is formed, the contamination due to Fe from the surface of the guiding member 8 to the silicon wafer surface can be suppressed. The Fe contamination of the wafer as a whole can be consequently reduced.

As described above, in the vertical boat for heat treatment 1 according to the present invention, as shown in FIG. 2, the oxide film and the like is not formed only on the portion that is to come into direct contact with the silicon wafer (the substrate supporting plate 9) in order to prevent the wafer back surface from being roughened, and another portion (the guiding member 8) is composed of quartz or the material on which the oxide film and the like is formed in order to suppress the contamination of Fe and the like to the silicon wafer, among the auxiliary supporting member 7. The vertical boat for heat treatment can thereby prevent the metal contamination to the silicon wafer greatly and also suppress the roughening on the wafer back surface after the heat treatment in comparison with a conventional boat.

On the other hand, a conventional boat contaminates the silicon wafer due to Fe and the like from its surface in the event that the whole of the auxiliary supporting member is composed of silicon carbide without the oxide film and the like. The conventional boat in which the oxide film and the like is formed on its whole surface roughens the wafer back surface that comes into contact with this.

It is to be noted that a material of the boat body 1 comprising four columns 2 and a pair of the plate members 3 coupled to both ends of each column 2 is preferably the same as the guiding member 8 because the Fe contamination of the wafer surface can be more reduced. A shape of these and the like can be, for example, the same as that of a conventional boat. An appropriate boat body may be prepared to effectively subject the silicon wafer to the heat treatment according to purpose.

Next, the method for heat treatment of a silicon wafer according to the present invention will be explained.

The method for heat treatment according to the present invention is performed by using the vertical boat for heat treatment 1 according to the present invention as shown in FIG. 1 and FIG. 2.

The auxiliary supporting member 7 is attached to the supporting part 6 of the boat body 4, the silicon wafer is placed on the placing surface 15 of the substrate supporting plate 9 of the auxiliary supporting member 7, and the heat treatment is performed. The heat treatment can be performed with the Fe contamination suppressed without roughening the back surface of the silicon wafer by the method for heat treatment according to the present invention.

It is to be noted that the method is not restricted in particular except for the step described above. For example, the heat treatment can be performed by the same process as a conventional method for heat treatment.

The temperature of the heat treatment is also not restricted in particular, but for example, the heat treatment can be performed at 1100 to 1300° C. Even though the heat treatment is performed at such a high temperature, the present invention can effectively suppress the metal contamination, such as Fe, in comparison with a conventional method.

Hereinafter, the present invention will be explained in more detail based on Example, but the present invention is not restricted thereto.

Example 1

The boat body of the vertical boat for heat treatment having four rectangular columns, a pair of plate members coupled to both ends of each column and a hundred of the wafer supporting parts on each column as shown in FIG. 1 was produced by machining.

It is to be noted that a material of the boat body for heat treatment was of SiC, its surface was CVD-coated with silicon carbide, and the surface roughness was approximately Ra=1 µm. One wafer was supported by four supporting parts. A length of two outside supporting parts (a front side of FIG. 1) was approximately 20 mm longer than that of two inside supporting parts (a back side of FIG. 1).

The auxiliary supporting member attached to the supporting part was produced which comprises a plate, as the substrate supporting plate, for supporting the wafer (a width of 5 mm, a length of 40 mm (short) and 60 mm (long), a thickness of 1.0 mm), and the guiding member (a width of 10.0 mm, a groove portion width of 8.0 mm, a length of 50 mm (short) and 70 mm (long), a thickness of 0.8 mm, a height of 2.8 mm) as shown in FIG. 2. The groove for fitting the supporting part of the boat body was formed on the back surface side of the guiding member so as to prevent the substrate supporting plate from falling down from the supporting part of the vertical boat for heat treatment. It is to be noted that a SiC substrate that was CVD-coated with silicon carbide and was subjected to the mirror-polishing was used for the substrate supporting plate, and quartz was used for the guiding member.

First, the vertical boat for heat treatment was cleaned with hydrogen fluoride, and then the auxiliary supporting members comprising the substrate supporting plate and the guiding member were attached to the wafer supporting parts of the vertical boat for heat treatment.

It is to be noted that when the auxiliary supporting member was attached, the upper surface of the substrate supporting plate was 0.2 mm higher than the upper surface of the guiding member.

The substrates to be treated (a mirror-polished silicon wafer having a plane orientation (100), a diameter of 200 mm and a thickness of 725 µm that was grown by the Czochralski method) were placed, the boat was introduced into a vertical furnace for heat treatment, and the heat treatment was performed at 1200° C. for 1 hour while an argon gas was supplied into the furnace.

The Fe concentration of the silicon wafer subjected to the heat treatment measured by the SPV method (Surface Photo Voltage method) was a maximum of $6\times10^{11}$ atoms/cm$^3$ and an average of $4\times10^{10}$ atoms/cm$^3$, and it was within a permissible range and a good result.

Haze of the back surface of the silicon wafer subjected to the heat treatment was measured. With SP-1 manufactured by KLA TENCOR CORPORATION, it was measured at a DWN mode under High-Throughput condition. The haze value was 0.06 ppm or less in the vicinity of the contact portion of the wafer with the wafer auxiliary supporting member, and the roughening on the surface did not occur.

Example 2

There was prepared the same boat body composed of SiC as Example 1, it was cleaned with hydrogen fluoride and a silicon oxide film having a thickness of approximately 500 nm was formed by thermal oxidation. Then the same auxiliary supporting members comprising the substrate supporting plate and the guiding member as Example 1 were attached to the supporting parts of the boat body.

The mirror-polished silicon wafers were placed, the boat was introduced into the vertical furnace for heat treatment, and the heat treatment was performed at 1200° C. for 1 hour while an argon gas was supplied into the furnace as with Example 1.

The Fe concentration of the silicon wafer subjected to the heat treatment measured by the SPV method was a maximum of $3\times10^{11}$ atoms/cm$^3$ and an average of $2\times10^{10}$ atoms/cm$^3$, and it was a very low value. A high quality annealed wafer was able to be obtained in which the Fe contamination was greatly suppressed.

The haze value of the back surface of the silicon wafer subjected to the heat treatment was 0.06 ppm or less in the vicinity of the contact portion of the wafer with the auxiliary supporting member, and the roughening on the surface did not occur.

Comparative Example 1

There were prepared conventional monolithic auxiliary supporting members that was not divided into the substrate supporting plate and the guiding member as shown in FIG. 3, unlike the present invention. FIG. 3(A) shows a condition where the auxiliary supporting member is attached to the supporting part. FIG. 3(B) shows a sectional view of the auxiliary supporting member attached to the supporting part. It is to be noted that as shown in FIG. 3(B), the supporting part was composed of silicon carbide in which a silicon oxide film was formed on its surface, and the auxiliary supporting member was composed of SiC CVD-coated with SiC and subjected to the mirror-polishing.

As with Example 2, the auxiliary supporting member described above was attached to the supporting part of the boat body in which a silicon oxide film having a thickness of approximately 500 nm was formed, the silicon wafers were placed on the auxiliary supporting members, and the heat treatment was performed at 1200° C. for 1 hour while an argon gas was supplied.

As with each Example, the haze value and the Fe contamination were measured.

The haze value of the back surface of the silicon wafer subjected to the heat treatment was 0.06 ppm or less in the vicinity of the contact portion with the auxiliary supporting member, and the roughening on the surface did not occur.

However, the Fe concentration measured by the SPV method was a maximum of $4\times10^{12}$ atoms/cm$^3$ and an average of $6\times10^{11}$ atoms/cm$^3$, and it was a very high value.

Comparative Example 2

Without attaching the auxiliary supporting member to the supporting part of the boat body in which a silicon oxide film having a thickness of approximately 500 nm was formed, as with Example 2, the silicon wafers were placed on the supporting parts, and the heat treatment was performed at 1200° C. for 1 hour while an argon gas was supplied.

As with each Example, the haze value and the Fe contamination were measured.

The Fe concentration of the silicon wafer subjected to the heat treatment measured by the SPV method was a maximum of $2\times10^{11}$ atoms/cm$^3$ and an average of $2\times10^{10}$ atoms/cm$^3$, and it was a low value.

However, the haze value of the back surface of the silicon wafer was 0.5 ppm or more in the vicinity of the contact portion with the supporting part, and the surface was roughened strongly.

As described in Example 1 and 2, when the heat treatment is performed with the vertical boat for heat treatment according to the present invention, a high quality annealed wafer in which the metal contamination, such as Fe, is suppressed can be obtained without an occurrence of roughening the wafer back surface strongly, unlike the conventional method for heat treatment as shown in Comparative Example 1 and 2.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A vertical boat for heat treatment having at least a boat body having: a plurality of columns; a pair of plate members coupled to both ends of each column; and a plurality of supporting parts on each column, each supporting part horizontally supporting a substrate to be treated, and an auxiliary supporting member removably attached to each of the plurality of the supporting parts, the auxiliary supporting member on which the substrate to be treated is to be placed, wherein the auxiliary supporting member has a guiding member attached to each supporting part and a substrate supporting plate fixed by the guiding member, the substrate supporting plate on which the substrate to be treated is to be placed, a hole is formed on an upper surface of the guiding member, the substrate supporting plate is inserted and fitted into the hole of the guiding member so as to be fixed, a height position of a surface on which the substrate to be treated is to be placed is higher than a height position of the upper surface of the guiding member with the auxiliary supporting member attached to the supporting part of the boat body, the substrate supporting plate is composed of any of silicon carbide, silicon, silicon carbide CVD-coated with silicon carbide, silicon CVD-coated with silicon carbide, and carbon CVD-coated with silicon carbide, and the guiding member is composed of any of quartz, silicon carbide on which a silicon oxide film is formed, silicon carbide on which a silicon nitride film is formed, silicon carbide on which a silicon oxynitride film is formed, silicon on which a silicon oxide film is formed, silicon on which a silicon nitride film is formed, silicon on which a silicon oxynitride film is formed.

2. The vertical boat for heat treatment according to claim 1, wherein the boat body is composed of any of quartz, silicon carbide on which a silicon oxide film is formed, silicon carbide on which a silicon nitride film is formed, silicon carbide on which a silicon oxynitride film is formed, silicon on which a silicon oxide film is formed, silicon on which a silicon nitride film is formed, silicon on which a silicon oxynitride film is formed.

3. The vertical boat for heat treatment according to claim 2, wherein the difference between the height position of the surface of the substrate supporting plate on which the substrate to be treated is to be placed and the height position of the upper surface of the guiding member is 0.05 to 1.0 mm.

4. The vertical boat for heat treatment according to claim 1, wherein the difference between the height position of the surface of the substrate supporting plate on which the substrate to be treated is to be placed and the height position of the upper surface of the guiding member is 0.05 to 1.0 mm.

5. A method for heat treatment of a silicon wafer using the vertical boat for heat treatment according to claim 1, comprising steps of:
attaching the auxiliary supporting member to each of the plurality of the supporting parts;
placing the silicon wafer on the substrate supporting plate of the auxiliary supporting member; and
performing the heat treatment.

6. The method for heat treatment of a silicon wafer according to claim 5, wherein the heat treatment of the silicon wafer is performed at 1100 to 1350° C.

7. A method for heat treatment of a silicon wafer using the vertical boat for heat treatment according to claim 2, comprising steps of
attaching the auxiliary supporting member to each of the plurality of the supporting parts;
placing the silicon wafer on the substrate supporting plate of the auxiliary supporting member; and
performing the heat treatment.

8. The method for heat treatment of a silicon wafer according to claim 7, wherein the heat treatment of the silicon wafer is performed at 1100 to 1350° C.

9. A method for heat treatment of a silicon wafer using the vertical boat for heat treatment according to claim 4, comprising steps of:
attaching the auxiliary supporting member to each of the plurality of the supporting parts;
placing the silicon wafer on the substrate supporting plate of the auxiliary supporting member; and
performing the heat treatment.

10. The method for heat treatment of a silicon wafer according to claim 9, wherein the heat treatment of the silicon wafer is performed at 1100 to 1350° C.

11. A method for heat treatment of a silicon wafer using the vertical boat for heat treatment according to claim 3, comprising steps of:
attaching the auxiliary supporting member to each of the plurality of the supporting parts;
placing the silicon wafer on the substrate supporting plate of the auxiliary supporting member; and
performing the heat treatment.

12. The method for heat treatment of a silicon wafer according to claim 11, wherein the heat treatment of the silicon wafer is performed at 1100 to 1350° C.

* * * * *